(12) United States Patent
Lee et al.

(10) Patent No.: US 7,375,560 B2
(45) Date of Patent: *May 20, 2008

(54) METHOD AND APPARATUS FOR TIMING DOMAIN CROSSING

(75) Inventors: Seonghoon Lee, Boise, ID (US); J. Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/495,848

(22) Filed: Jul. 28, 2006

(65) Prior Publication Data

US 2006/0261867 A1 Nov. 23, 2006

Related U.S. Application Data

(63) Continuation of application No. 10/931,397, filed on Aug. 31, 2004, now Pat. No. 7,084,680.

(51) Int. Cl.
*H03L 7/00* (2006.01)

(52) U.S. Cl. ...................................... 327/141; 713/600

(58) Field of Classification Search ................ 327/141, 327/145, 159, 161, 162, 112; 365/233; 375/371; 711/167; 713/600; 714/699
See application file for complete search history.

(56) References Cited

U.S. PATENT DOCUMENTS

| | | | |
|---|---|---|---|
| 5,892,920 A | 4/1999 | Arvidsson et al. | |
| 5,915,107 A | 6/1999 | Maley et al. | ............... 395/551 |
| 6,333,893 B1 | 12/2001 | Keeth et al. | ............... 365/233 |
| 6,604,179 B2 | 8/2003 | Volk et al. | ................... 711/167 |
| 6,605,970 B1 | 8/2003 | Keeth et al. | ................ 327/159 |
| 7,016,447 B1 * | 3/2006 | Reuveni | ..................... 375/371 |
| 2002/0128812 A1 | 9/2002 | Gooding et al. | .............. 703/23 |
| 2002/0149992 A1 | 10/2002 | Faue | .......................... 365/233 |
| 2002/0194520 A1 | 12/2002 | Johnson | ..................... 713/600 |
| 2003/0063514 A1 | 4/2003 | Faue | ...................... 365/230.03 |
| 2003/0081713 A1 | 5/2003 | Pontius et al. | .............. 375/372 |
| 2004/0153891 A1 | 8/2004 | Slutz et al. | ................. 714/699 |

OTHER PUBLICATIONS

Collins et al.: "DDR-SDRAM, High-Speed, Scource-Synchronous Interfaces Create Design Challenges," Design Feature www.ednmag.com, Sep. 2, 1999, pp. 63-66.

* cited by examiner

*Primary Examiner*—N. Drew Richards
*Assistant Examiner*—Ryan C. Jager
(74) *Attorney, Agent, or Firm*—TraskBritt

(57) ABSTRACT

A timing domain crossing apparatus and method of transferring signals between timing domains are disclosed. A receiver samples a data signal with a sample clock in a first timing domain. The sampled data signal is expanded to a plurality of expansion signals, which are held valid for a plurality of consecutive active clock cycles. A data order adjuster may re-order the plurality of expansion signals to a predetermined order. A timing generator samples a command signal with an internal clock in a second timing domain to generate a re-timing strobe. The re-timing strobe may be temporally positioned to be within the expansion data window and used to sample the plurality of expansion signals in the second timing domain. The timing domain crossing apparatus and method of signal sampling may be incorporated in a semiconductor device, which may be fabricated on a semiconductor wafer and included in an electronic system.

22 Claims, 12 Drawing Sheets

US 7,375,560 B2

METHOD AND APPARATUS FOR TIMING DOMAIN CROSSING

CROSS-REFERENCE TO RELATED APPLICATION

This application is a continuation of application Ser. No. 10/931,397, filed Aug. 31, 2004, now U.S. Pat. No. 7,084,680, issued on Aug. 1, 2006.

BACKGROUND OF THE INVENTION

1. Field of the Invention

This invention relates generally to a timing domain crossing method and apparatus and more particularly to a timing domain crossing method and apparatus for use in enhanced data rate systems such as double data rate systems.

2. Description of Related Art

In modern high frequency semiconductor and system design, timing margins for passing signals between devices are increasingly constrained by the higher clock frequencies and increased data bandwidth requirements. Historically, devices generated output signals with a propagation delay from a system input clock. As clock periods shrink, these delays from clock input to output signal consume larger and larger percentages of a clock period until, in some systems, the output signal delay becomes larger than the clock period. This situation presents difficulties in sampling the output signal at a receiving device on a definite clock cycle. As a result, many systems have turned to source synchronous clocking in attempts to increase timing margins and sampling windows at the data destination. In source synchronous clocking, the device generating the data also sends a clock signal along with the data signals to reduce time delay between clock and data. Additionally, by using similar output buffers for clock and data on the sending device, along with similar input buffers for clock and data on the receiving device, skew between clock and data may be reduced.

Some systems take advantage of this increased timing margin to send new data on both rising and falling edges of the clock rather than the more traditional rising edge only or falling edge only communication. This "double data rate" (DDR) communication increases data bandwidth while maintaining a lower clock frequency because two packets of data are sent for each clock period rather than the more traditional one data packet per clock period.

Source synchronous clocking and DDR communication are used alone or in combination in a variety of communication busses. DDR Dynamic Random Access Memory (DRAM) is an example of a system that uses both source synchronous clocking and DDR communication.

FIG. 1 illustrates a logic diagram of an implementation that may be used to sample DDR data at a receiver and present the data to other internal circuitry timed to an internal clock. In the FIG. 1 implementation, data 10 is sampled by falling edge flip-flop 20 clocked by a write strobe 12 and data 10 is also sampled by rising edge flip-flop 30 clocked by the write strobe 12. To re-time the data sampled by rising edge flip-flop 30, falling edge flip-flop 35, clocked by the write strobe 12, samples the output of the rising edge flip-flop 30. Many communication systems generate bursts of data. The burst size may be related to internal bus widths on devices. As a result, the FIG. 1 implementation also includes delay registers for portions of the sampled data to widen the burst data to from a burst of four serial data packets to a bus that is four data packets wide and all four data packets can be presented to subsequent circuitry on the same clock cycle. Delay register 40 samples the signal QPf to create a delayed data signal QPn. Similarly, delay register 50 samples the signal QN to create a delayed data signal QPn.

A timing generator 60 uses a clock signal 16 to sample a command signal 14, which may be a bus of signals, to determine whether data will be presented on the data bus in a write cycle. Conventionally, the command signal 14, indicating a write cycle on the data bus, may occur multiple clock cycles before data is presented on the data 10. The timing generator 60 determines this time delay to generate a timing strobe RTS when all four data packets are available at the appropriate active edge of the clock signal 16. Re-timing registers (72, 74, 76, and 78), clocked by the timing strobe RTS sample these four data packets for parallel presentation to subsequent circuitry (not shown).

FIG. 2 illustrates timing of various signals to illustrate operation of the FIG. 1 implementation. Referring to FIG. 1 and FIG. 2, a command is generated at the second clock cycle, which is followed by a burst of four data packets (R0, F0, R1, and F1) and a corresponding write strobe 12 to be used for sampling the data packets. Rising edge flip-flop 30 samples the R0 data packet on the first rising edge of the write strobe 12 and samples the R1 data packet on the second rising edge of the write strobe 12. The R0 and R1 data packets are subsequently transferred to data packets timed to the falling edge of write strobe 12 by falling edge flip-flop 35. Falling edge flip-flop 20 samples the F0 data packet on the second falling edge of the write strobe 12 and samples the F1 data packet on the third falling edge of write strobe 12. The delay register 40 and delay register 50 respectively sample the R0 and R1 data packets at the third falling edge of the write strobe 12. As a result, all four data packets are available in parallel after the third falling edge of the write strobe 12.

The timing generator 60 uses delays or counters to determine when all four data packets are available in parallel to generate a re-timing strobe RTS. In this case, the re-timing strobe RTS is generated at the rising edge of the sixth clock cycle. The re-timing strobe RTS is used by the re-timing registers (72, 74, 76, and 78) to synchronize the four data packets to the clock signal for presentation to other circuitry (not shown).

While the source synchronous timing and the double data rates may enable reliable high bandwidth, they may create problems at the receiving end if the data needs to be re-synchronized to the system clock. DDR DRAM timing may be used as an example to illustrate these problems. As shown in FIG. 3, the write strobe 12, which is generated from the system clock by a transmitting device, may have a delay relative to the system clock as small as tDQSSmin and as large as tDQSSmax, resulting in an uncertainty window tSQ. Depending on system implementation, device parameters, and operating conditions, the write strobe 12 may occur anywhere within the uncertainty window tSQ. Because the write strobe 12 has an uncertainty window, all the signals derived from flip-flops using the write strobe 12 contain this same uncertainty, as shown in FIG. 3 for the signals Data, QP, QPf, QN, QPn, and QNn.

This uncertainty results in a reduction in amount of time that the data packets are valid for sampling by the re-timing strobe RTS. This valid data window (tV) may be defined as the clock period (tCK) minus the uncertainty window (tSQ). In other words, tV=tCK−tSQ. For many DDR DRAM devices, tDQSSmax and tDQSSmin are expressed as percentages of a clock cycle. For example, plus or minus 25% may be used in many applications, resulting in an uncertainty window tSQ of 50% of a clock cycle. Therefore, the valid data window can be expressed as tV=tCK−0.5 tCK=0.5 tCK. For a 100 MHz clock, this means a generous 5 nSec, however, for a 1 GHz clock this leaves a valid data window of only 0.5 nSec.

In addition, other factors may reduce this timing margin even further. Signals within a device may exhibit jitter and skew related to variations in Process, Voltage, and Temperature (PVT) variations. These jitter/skew variations introduce an additional uncertainty tJS. Including the tJS uncertainty, the valid data window becomes: tV=tCK−tSQ−tJS. Obviously, tJS may be dependent on current process technology. With current process technologies, tJS may be several hundred pSec regardless of operating frequency, or sometimes may increase as operating frequency increases. Assuming 500 pSec for tJS, an uncertainty window tSQ of 50% of a clock cycle, and a 1000 pSec clock cycle, the valid data window becomes: tV=1000−50% (1000)−500=0, leaving no timing margin to reliably sample the data packets. It is clear that timing margin decreases rapidly as the clock period decreases, because there is not necessarily a corresponding decrease in the tJS uncertainty.

There is a need for an apparatus and method to sample source synchronous data and DDR data, which enables larger timing margins and reliability in transferring data from the source synchronous timing domain to an internal clock timing domain.

BRIEF SUMMARY OF THE INVENTION

An embodiment of the present invention comprises a method of transferring signals between timing domains. The method includes sampling a data signal with a sample clock associated with a first timing domain to generate a sampled data signal. The sampled data signal is expanded to a plurality of expansion signals, which are valid for an expansion data window. The expansion data window may comprise a plurality of consecutive sample clock cycles. A re-timing strobe may be generated in a second timing domain. The re-timing strobe may be derived from a command signal such that the re-timing strobe may be temporally positioned within the expansion data window. The re-timing strobe samples the plurality of expansion signals in the second timing domain.

Another embodiment of the present invention comprises a method of transferring signals between timing domains. The method includes sampling a data signal with a sample clock associated with a first timing domain to generate a sampled data signal. The sampled data signal is expanded to a plurality of expansion signals, which are valid for an expansion data window. The expansion data window may comprise a plurality of consecutive sample clock cycles. The plurality of expansion signals may be re-ordered, if needed, to a predetermined order, independent of the order in which they were received on the data signal. A re-timing strobe may be generated in a second timing domain. The re-timing strobe may be derived from a command signal such that the re-timing strobe may be temporally positioned within the expansion data window. The re-timing strobe samples the plurality of expansion signals in the second timing domain.

Another embodiment of the present invention comprises a timing domain crossing apparatus. The apparatus comprises a receiver configured for sampling a data signal with a sample clock in a first timing domain to create a sampled data signal. An expander is configured for sampling the sampled data signal at a plurality of consecutive active edges of the sample clock to generate a plurality of expansion signals valid for an expansion data window in the first timing domain. A timing generator may be used to sample a command signal with an internal clock in a second timing domain and may generate a re-timing strobe in the second timing domain. The re-timing strobe may be temporally positioned to be within the expansion data window. A re-timing register may use the re-timing strobe to sample the plurality of expansion signals in the second timing domain.

Another embodiment of the present invention comprises a timing domain crossing apparatus. The apparatus comprises a receiver configured for sampling a data signal with a sample clock in a first timing domain to create a sampled data signal. An expander is configured for sampling the sampled data signal at a plurality of consecutive active edges of the sample clock to generate a plurality of expansion signals valid for an expansion data window in the first timing domain. A data order adjuster may be employed to re-order the plurality of expansion signals, if needed, to a predetermined order, which may be independent from a receiving order of each of the data signals. A timing generator may be employed to sample a command signal with an internal clock in a second timing domain and generate a re-timing strobe in the second timing domain. The re-timing strobe may be temporally positioned to be within the expansion data window. A re-timing register may use the re-timing strobe to sample the plurality of expansion signals in the second timing domain.

Another embodiment of the present invention comprises a semiconductor device including at least one timing domain crossing apparatus according to the invention described herein.

Another embodiment of the present invention includes a plurality of semiconductor memories incorporating at least one timing domain crossing apparatus according to the present invention fabricated on a semiconductor wafer.

Yet another embodiment, in accordance with the present invention, comprises an electronic system including an input device, an output device, a processor, and a memory device. The memory device comprises at least one semiconductor memory incorporating at least one timing domain crossing apparatus according to the present invention.

BRIEF DESCRIPTION OF THE DRAWINGS

In the drawings, which illustrate what is currently considered to be the best mode for carrying out the invention.

DETAILED DESCRIPTION OF THE INVENTION

Figure 1:
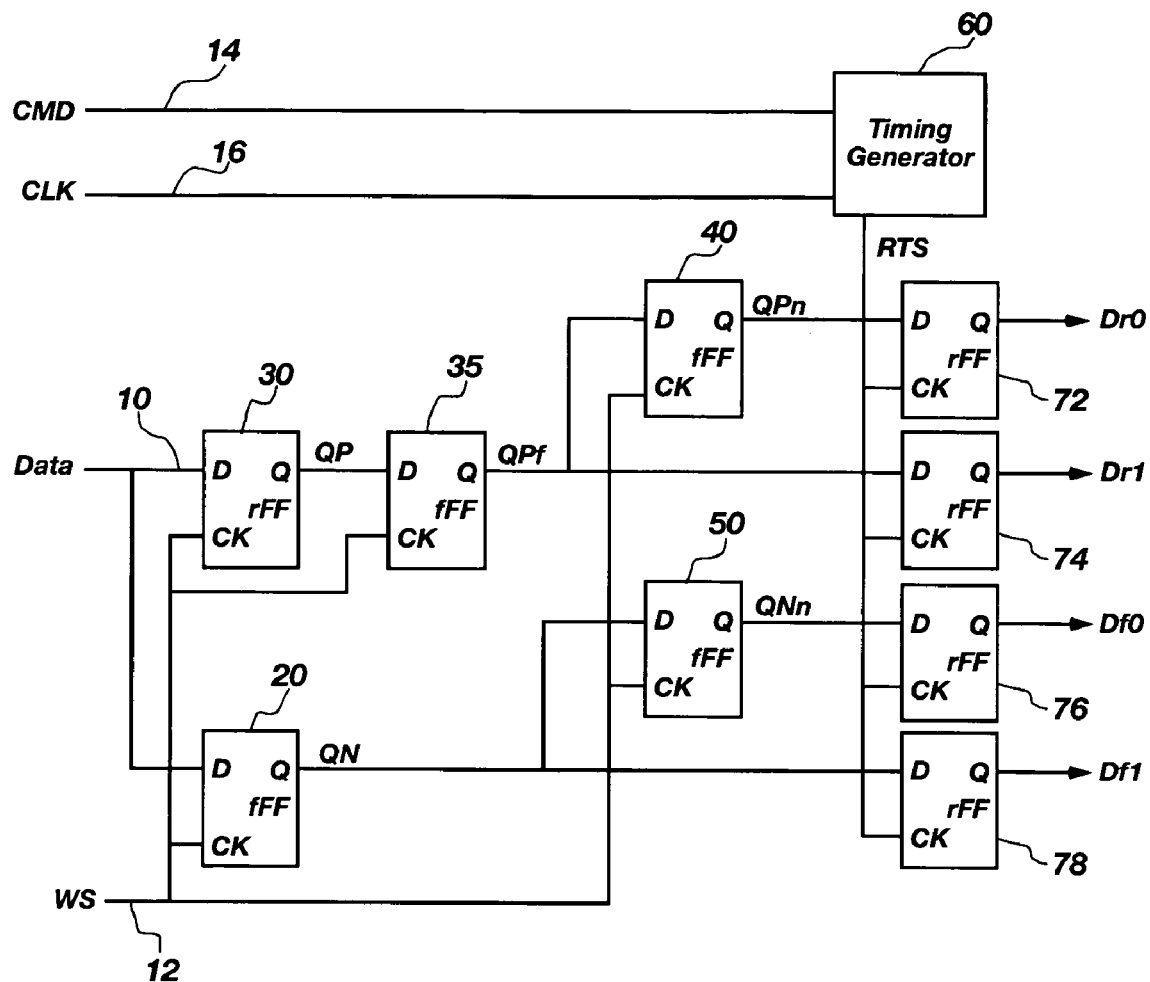
FIG. 1 is a block diagram of a conventional timing domain crossing apparatus.
Figure 2:
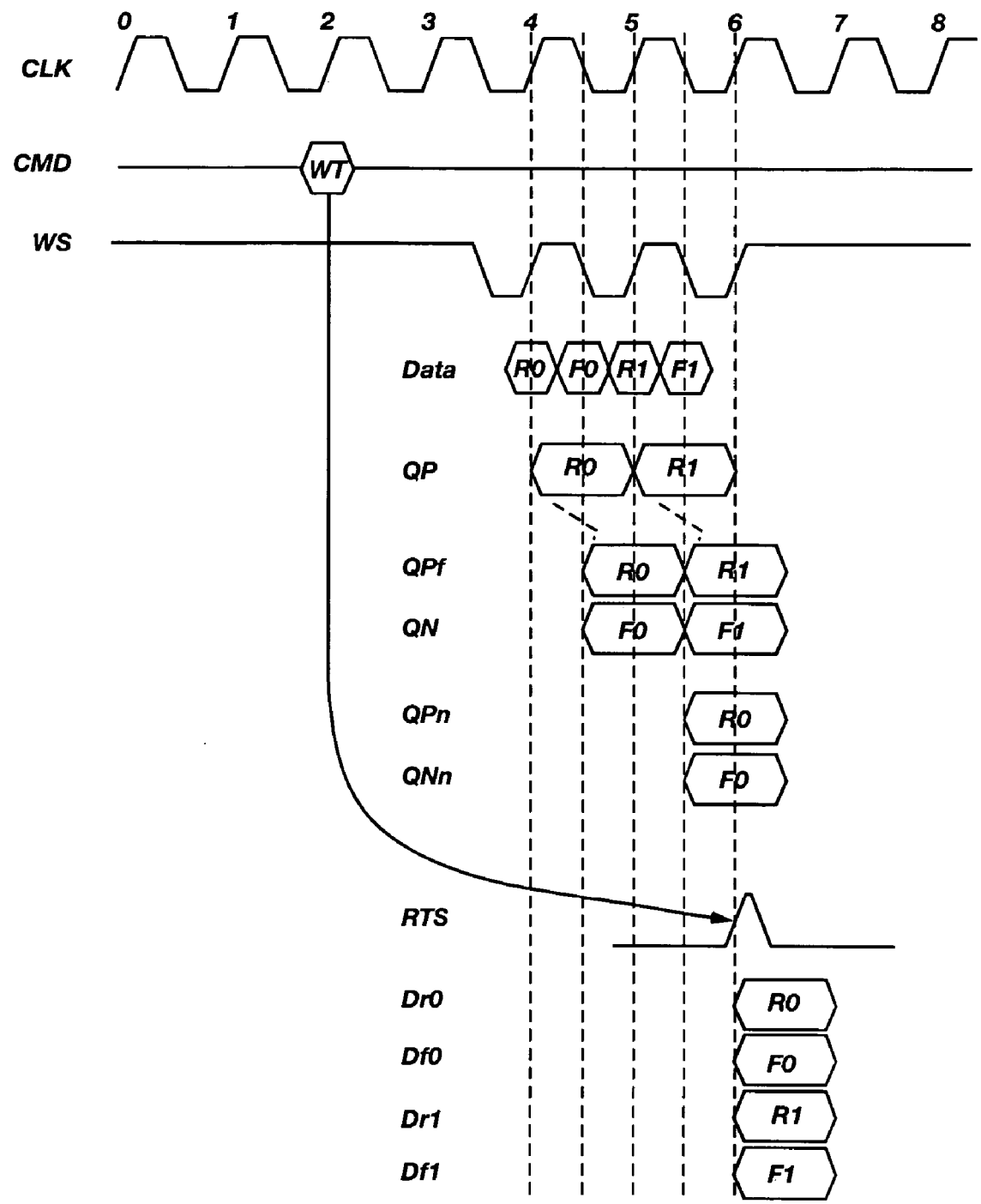
FIG. 2 is a timing diagram illustrating timing for various signals of the conventional timing domain crossing apparatus of FIG. 1.
Figure 3:
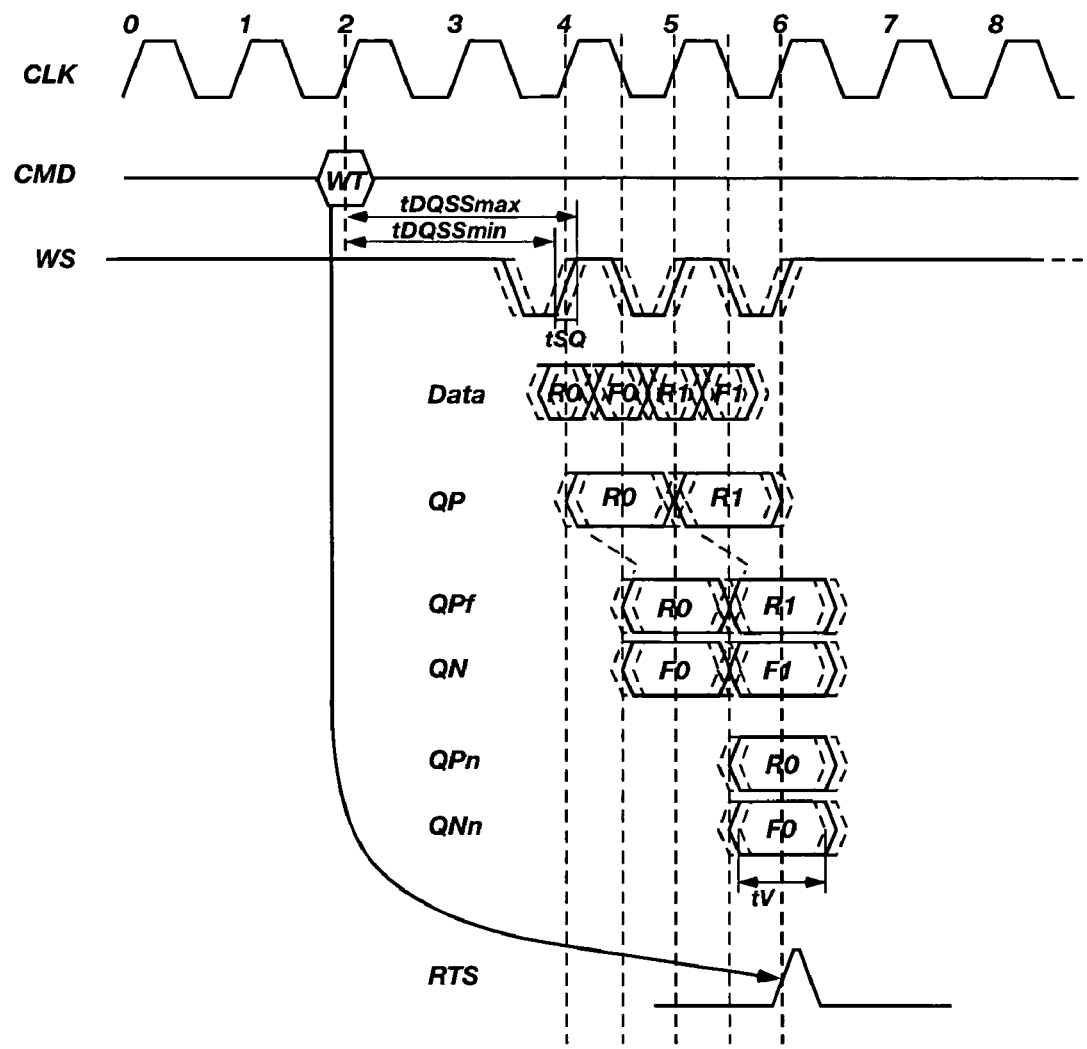
FIG. 3 is a timing diagram illustrating timing margins for various signals of the conventional timing domain crossing apparatus of FIG. 1.

In the following description, circuits and functions may be shown in block diagram form in order not to obscure the present invention in unnecessary detail. Conversely, specific circuit implementations shown and described are exemplary only and should not be construed as the only way to implement the present invention unless specified otherwise herein. Additionally, block definitions and partitioning of logic between various blocks is exemplary of a specific implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

The term "bus" is used to refer to a plurality of signals or conductors, which may be used to transfer one or more various types of information, such as data, addresses, control, or status. Additionally, a bus or collection of signals may be referred to in the singular as a signal.

In this description, "data signal" is used to indicate a signal to be sampled by one or more clocks. It will be readily apparent to those skilled in the art that the present invention may apply to any type of communication signal to be sampled. Therefore, the term "data signal" may apply to any signal to be sampled, such as, for example only, data signals, address signals, control, signals, status signals, and timing signals. Additionally, some drawings illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal. Additionally, a sampled value of a data signal (or data bus) may be referred to as a data packet.

The terms "assert" and "negate" are respectively used when referring to the rendering of a signal, status bit, or similar apparatus into its logically true or logically false state. Accordingly, if a logic level one or a high voltage represents a logically true state (i.e., asserted state), a logic level zero or a low voltage will represent the logically false state (i.e., negated state). Conversely, if a logic level zero or a low voltage represents the logically true state (i.e., asserted state), a logic level one or a high voltage will represent the logically false state (i.e., negated state).

Within this application the term "timing domain" is used to indicate a domain of signals having timing associated with a set of related clocks, or a set of related clocks with related timing phases or skews. The term timing domain, as used herein, is intended to encompass the term "time domain" as used by many persons of ordinary skill in the art when referring to these sets of related clocks, or sets of related clocks with related timing phases or skews.

Figure 4:
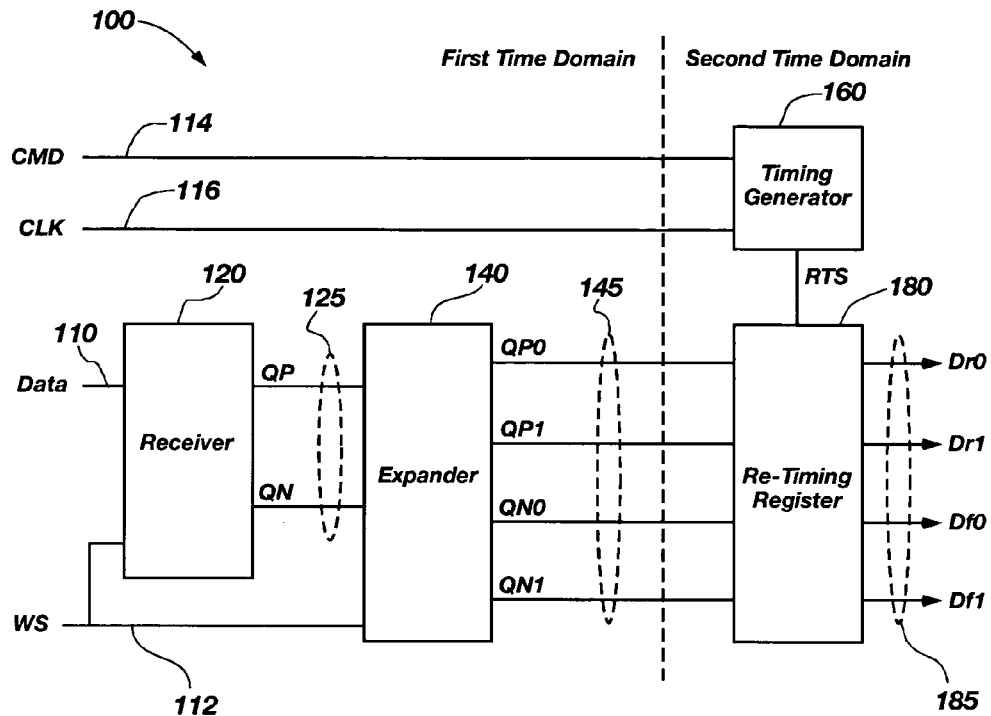
FIG. 4 is a block diagram illustrating an exemplary embodiment of a timing domain crossing apparatus according to the present invention.

FIG. 4 illustrates an exemplary embodiment of a timing domain crossing apparatus 100 according to the present invention. The FIG. 4 embodiment comprises a receiver 120, an expander 140, a timing generator 160, and a re-timing register 180. The receiver 120 samples the data signal 110 using the rising edge and falling edge of a write strobe 112 (also referred to as a sample clock) to present data on the QP signal and QN signal respectively. Data sampling using the write strobe 112 occurs in a first timing domain. The expander 140, operating in the first timing domain, modifies the timing window for which the data is available for sampling by the re-timing register 180 in a second timing domain. As explained in the background section, conventional implementations generate a valid timing window of $tV=tCK-tSQ-tJS$. The expander 140 creates a storage mechanism to expand the width of data signals available, allowing the data to be held valid for multiple clock cycles as will be explained more fully below. If the valid data window for data leaving the expander 140 is expanded to two clock cycles, the resulting valid timing window is increased to $tV=2*tCK-tSQ-tJS$. The timing generator 160 samples the command signal 114 in the second timing domain, using the system clock 116, and generates a re-timing strobe RTS in the second timing domain optimized for sampling the expansion signals 145 in the second timing domain with a larger timing margin. Finally, the re-timing registers 180 sample the expansion signals 145 using the re-timing strobe RTS in the second timing domain, to generate output signals 185 in the second timing domain for presentation to additional circuitry (not shown) in the second timing domain.

Figure 5:
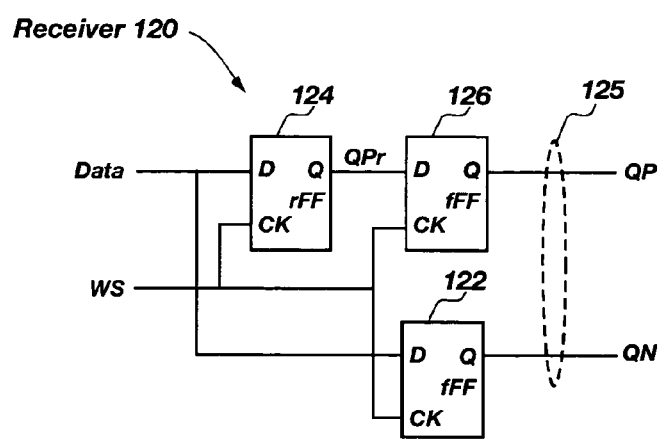
FIG. 5 is a block diagram illustrating an exemplary embodiment of a receiver.

An exemplary receiver 120 is shown in FIG. 5. Falling edge flip-flop 122 samples data on falling edges of the write strobe 112 and rising edge flip-flop 124 samples data on rising edges of the write strobe 112. Intermediate data signal QPr from rising edge flip-flop 124 is further sampled by falling edge flip-flop 126. A resulting sampled data signal 125 comprising a rising data packet QP, which was initially sampled on a rising edge of the write strobe 112, and a falling data packet QN are output from the sampler on a falling edge of the write strobe 112.

As stated earlier, while the data signal 110, falling data packet QN and rising data packet QP may be represented as a single signal for ease of discussion, it will be readily apparent to a person of ordinary skill in the art that the sampler may sample and generate busses comprising a plurality of signals using a register comprising a plurality of flip-flops. In addition, detailed descriptions may use single signals or busses depending on context and simplicity of description. In addition, the FIG. 5 exemplary embodiment illustrates an apparatus for sampling DDR data. It will be readily apparent to a person of ordinary skill in the art that, while not shown in the figures, the sampler may sample data on a single edge of the clock and present a sampled data signal 125 on that edge only rather than presenting two sampled data signals 125 representing data sampled on both edges of the write strobe 112.

Figure 6:
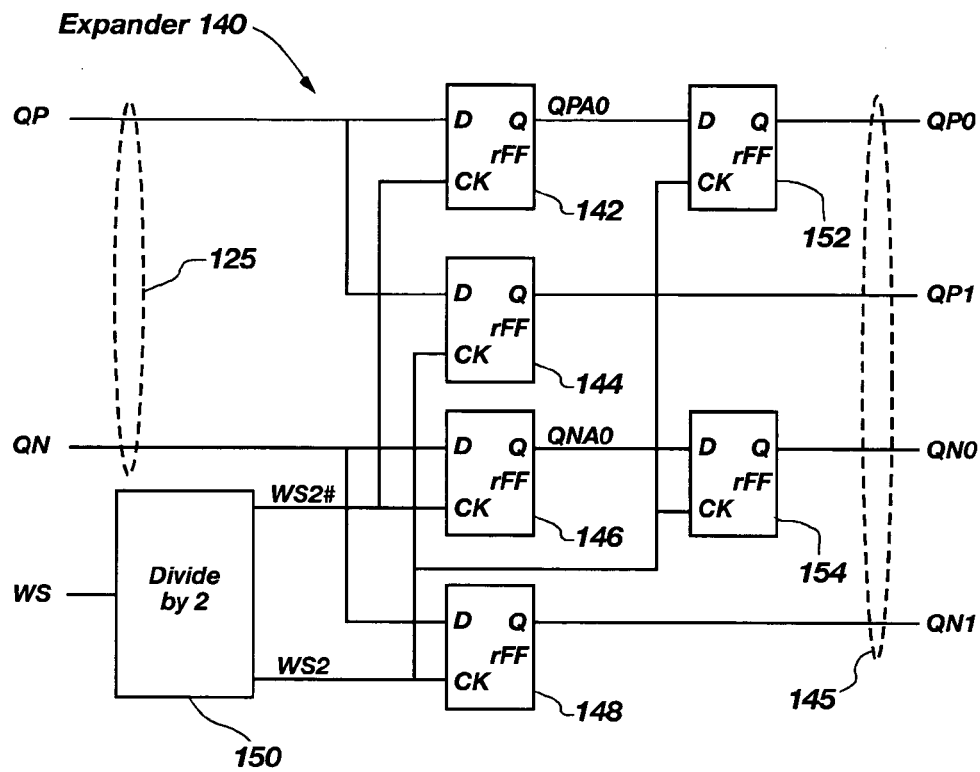
FIG. 6 is a block diagram illustrating an exemplary embodiment of an expander.

An exemplary expander 140 is shown in FIG. 6. The expander 140 includes a divide-by-two module 150 to generate a doubled write strobe WS2 and an inverted doubled write strobe WS2#, which are both at one-half the frequency of the write strobe 112, out of phase with each other, and triggered by the rising edge of the write strobe 112. In effect, the two doubled write strobes (WS2 and WS2#) are used to sample the sampled data signal 125 at every other clock cycle to generate an expansion data window 240 (shown in the various timing diagrams), in which the expansion signals 145 are valid. The expander 140 generates a first rising data packet QP0, a second rising data packet QP1, a first falling data packet QN0, and a second falling data packet QN1 (collectively referred to as expansion signals 145) on the rising edge of the doubled write strobe WS2 (i.e., every other rising edge of the write strobe 112).

In detail, a rising edge on the doubled write strobe WS2 samples the rising data packet QP and the falling data packet QN using rising edge flip-flops 144 and 148 to generate the second rising data packet QP1 and the second falling data packet QN1, respectively. Similarly, a rising edge on the inverted doubled write strobe WS2# samples the rising data packet QP and the falling data packet QN using rising edge flip-flops 142 and 146, respectively. The resulting outputs of rising edge flip-flops 142 and 146 are respectively labeled as an intermediate rising data packet QPA0 and an intermediate falling data packet QNA0. To complete the timing and present all the expansion signals 145 at the same time, a rising edge on the doubled write strobe WS2 samples the intermediate rising data packet QPA0 and intermediate falling data packet QNA0 using rising edge flip-flops 152 and 154 to generate the first rising data packet QP0 and the first falling data packet QN0, respectively.

By presenting the expansion signals 145 on every other write strobe cycle, the expander 140 has created expansion signals 145 with twice the bus width of the sampled data signals 125 and an expansion data window for the expansion signals 145 that spans two sample clock cycles. As a result, the valid timing window for the expansion signals 145 is increased to: tV2=2*tCK−tSQ−tJS.

Figure 7:
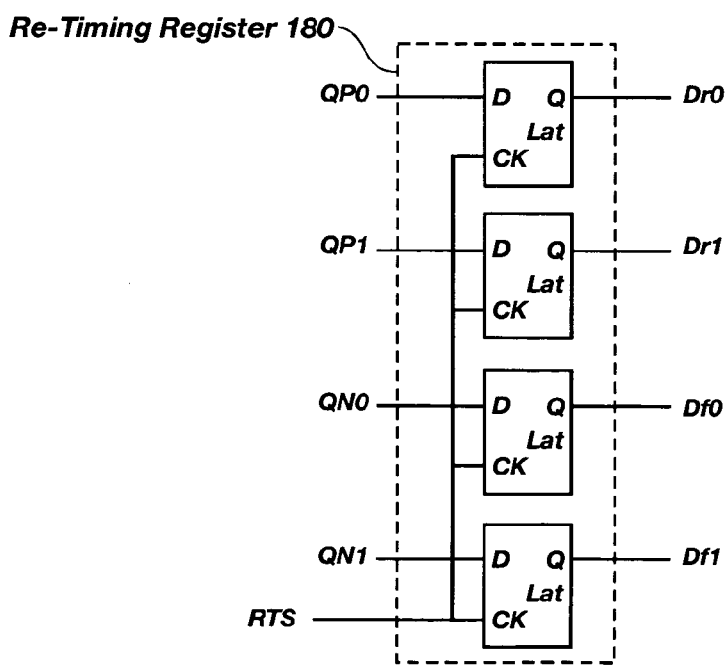
FIG. 7 is a block diagram illustrating an exemplary embodiment of a re-timing register.

The re-timing register 180, shown in FIG. 7, brings the expansion signals 145 into the second timing domain. In this embodiment of the re-timing register 180, four positive level triggered latches use the re-timing strobe RTS to latch the expansion signals 145 for presentation on output signals 185 in the second timing domain. Latches are used so that the output signals 185 will reflect the data on the expansion signals 145 when the re-timing strobe RTS goes high, and hold the output signals 185 at the value present on the expansion signals 145 when the re-timing strobe RTS goes low. However, it will be readily apparent to the person of ordinary skill in the art that active low level latches may be used. Additionally, in some embodiments, flip-flops may be used rather than latches.

The timing generator 160, shown in FIG. 4, samples the command signal 114 with the internal clock 116 (also referred to as CLK in the drawings). The internal clock 116 is internally derived from a system clock input, which was used to generate the data signal 110 and write strobe 112 in the transmitting device. When the timing generator 160 samples a write command (or any command that indicates data will follow on the data signal 110), it will generate the re-timing strobe RTS. The timing generator 160 generates the re-timing strobe RTS to pulse within the expansion data window 240 for sampling the expansion signals 145 as explained above when discussing the re-timing register 180. The timing of the expansion data window 240 may be determined by the timing generator 160 using a variety of factors, such as, for example: the number of clock cycles between the write command and the first data packet on the data signal 110, the number of write strobe cycles of delay created by the receiver 120 and expander 140, and additional timing to compensate for the uncertainty window tSQ and jitter/skew window tJS.

Figure 8:
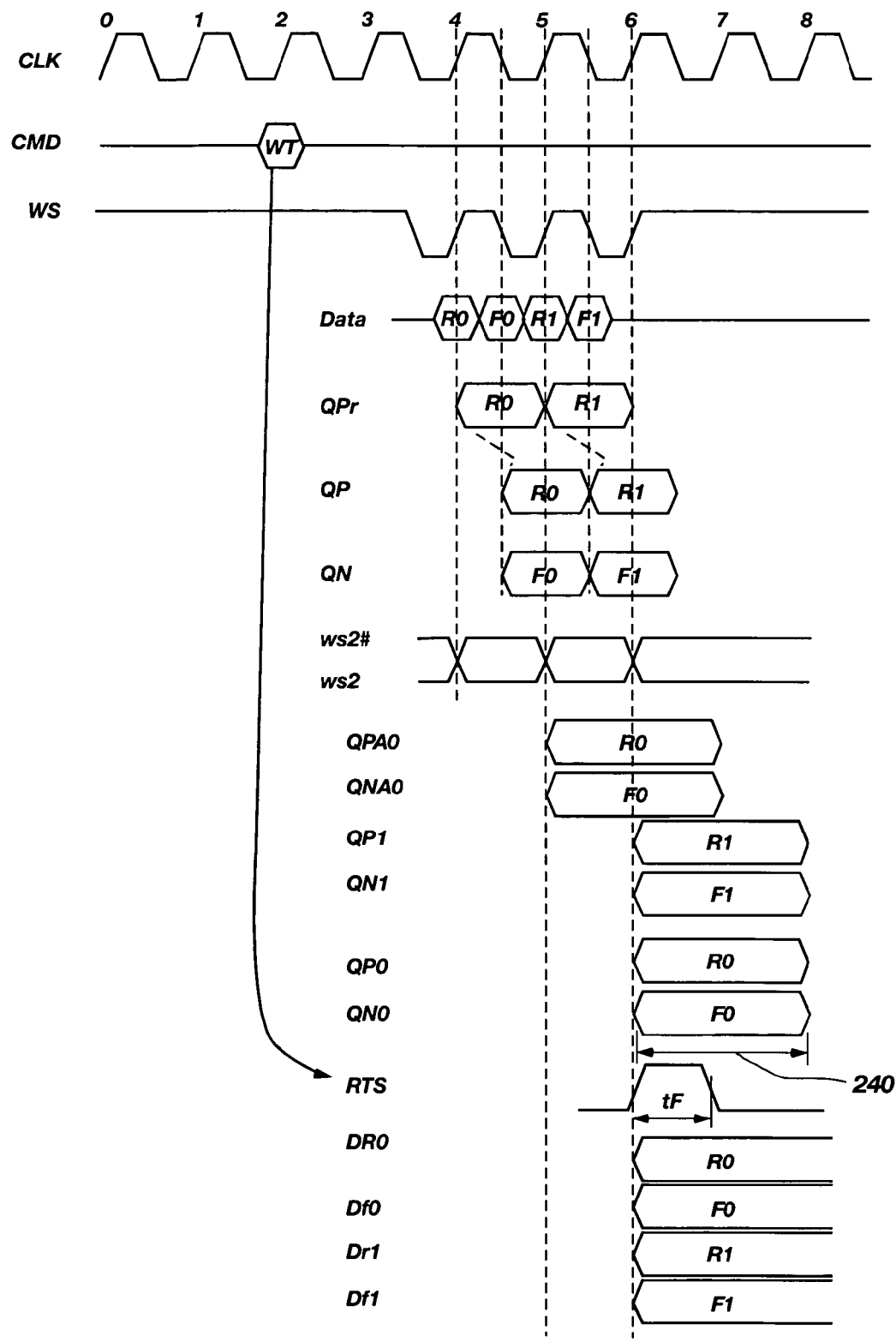
FIG. 8 is a timing diagram illustrating timing for various signals of the exemplary embodiment shown in FIGS. 4-7.

Operation may be explained by referring to FIG. 8 for timing and FIGS. 4-7 for functionality. A write command, shown in FIG. 8 on the command bus, is followed by a toggling write strobe 112 (also referred to as WS in the drawings) and a DDR data burst on the data bus. The receiver 120 samples rising edge data on the data bus to generate the intermediate data signal QPr. The intermediate data signal QPr is subsequently delayed to the following falling edge of the write strobe 112 where it is presented as rising data packets QP. These rising data packets QP coincide with the falling data packets QN, which are sampled on the falling edge of the write strobe 112.

The divide by two module generates doubled write strobe WS2 and inverted doubled write strobe WS2# to serve as clocks for sampling the sampled data signals 125 (i.e., QP and QN). The expander 140 samples the R0 data packet and the F0 data packet on the expansion signals 145 at the rising edge of the inverted doubled write strobe WS2# to generate the intermediate rising data packet QPA0 and the intermediate falling data packet QNA0, respectively. The two intermediate data packets (QPA0 and QNA0) along with the rising data packet QP and falling data packet QN are sampled on the next rising edge of the doubled write strobe WS2. These resulting outputs from the expander (QP0, QN0, QP1, and QN1) are all aligned to the rising edge of the doubled write strobe WS2 and have an expansion data window 240, of about two write strobe cycles.

The timing generator 160 creates the re-timing strobe RTS to go high at the clock edge where the expansion data signals are first valid. The timing generator 160 may adjust timing of the falling edge of the re-timing strobe RTS, which closes the latches, to a temporal position at about the mid-point of the expansion data window 240.

The previously described embodiment works well for systems where it may be predetermined that data bursts always begin on an even clock cycle or an odd clock cycle. However, if data bursts may begin on either an even clock cycle or an odd clock cycle, the previous embodiment may swap the order of sampling the data such that the data packets when widened out to the four packet width may be in an improper order.

Figure 9:
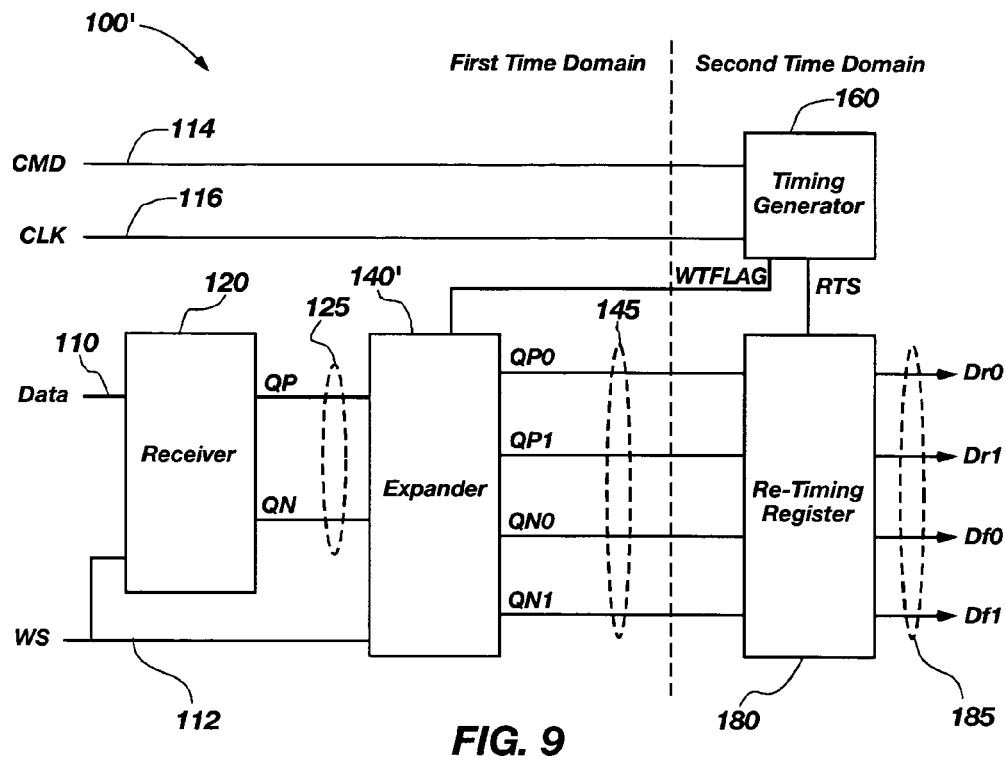
FIG. 9 is a block diagram illustrating another exemplary embodiment of a timing domain crossing apparatus according to the present invention.
Figure 10:
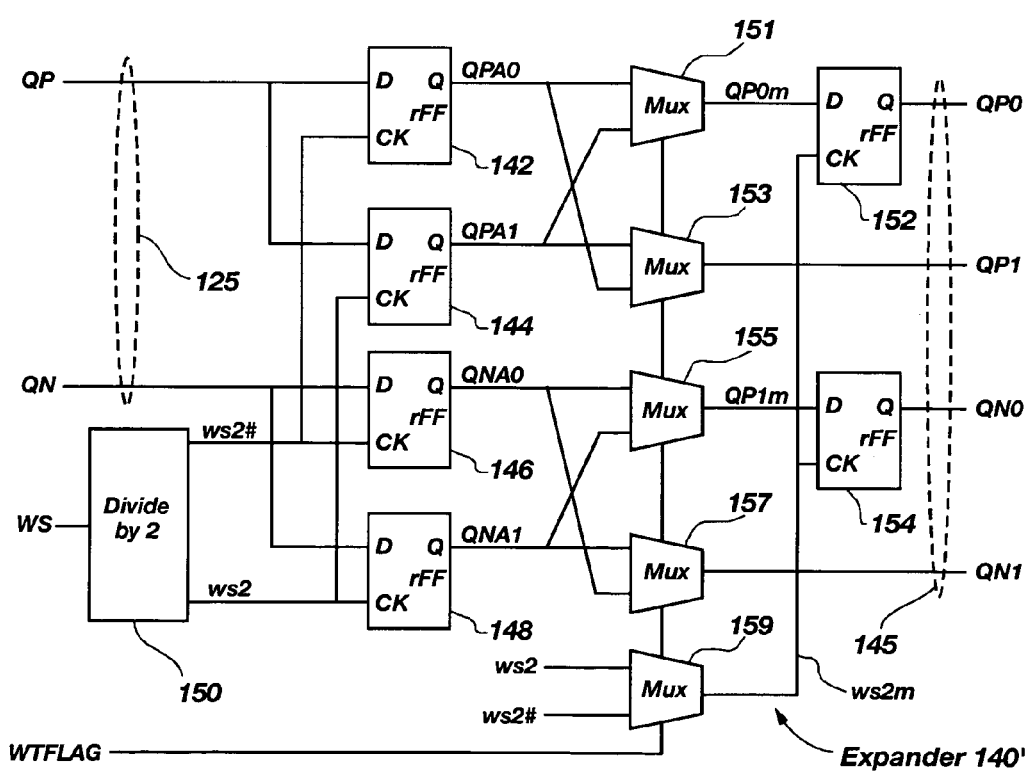
FIG. 10 is a block diagram illustrating another exemplary embodiment of an expander.
Figure 11:
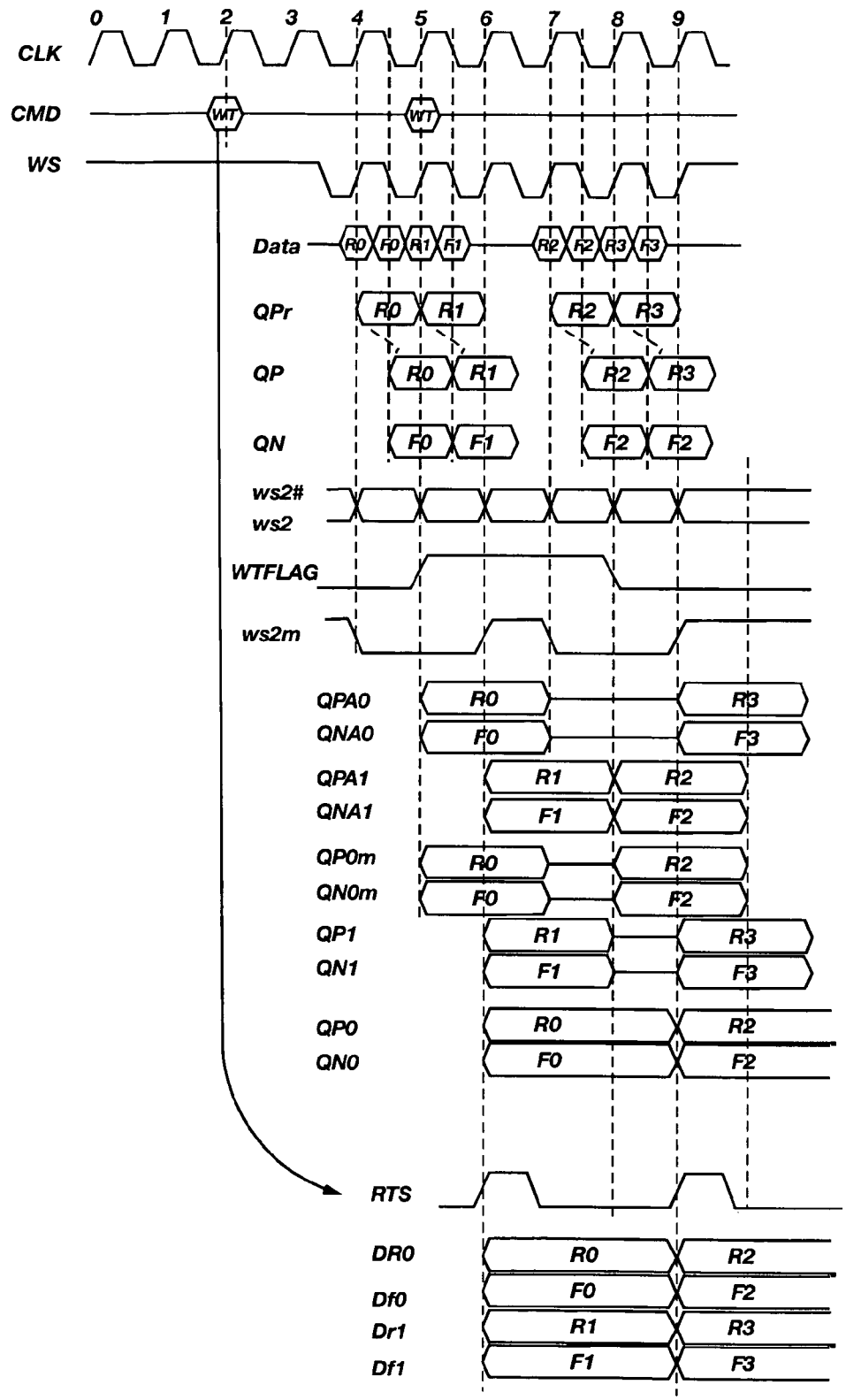
FIG. 11 is a timing diagram illustrating timing for various signals of the exemplary embodiment shown in FIG. 9.

Another embodiment of the timing domain crossing apparatus 100', shown in FIG. 9, with a different embodiment of the expander 140', shown in FIG. 10, may be used to re-align the data packets to a proper order. For purposes of discussion, data bursts which operate with no need for re-alignment are referred to as even data bursts, in reference to the burst beginning on an even clock cycle of the clock as shown in FIG. 11. Data bursts which begin on an odd clock cycle, as shown in FIG. 11, will be referred to as odd data bursts. It will be readily apparent to a person of ordinary skill in the art that naming the bursts as even or odd is somewhat arbitrary. In function, it is only necessary to identify data bursts that require re-alignment and data bursts that do not require re-alignment.

The timing domain crossing apparatus 100' of FIG. 9 is similar to the timing domain crossing apparatus 100 of FIG.

4, except for the use of another embodiment of the expander 140'. In this expander 140' embodiment, shown in FIG. 10, a group of multiplexers (151, 153, 155, and 157) is used to re-route data for odd data bursts. Additionally, a clock multiplexer 159 is added to determine whether the doubled write strobe WS2 or the inverted doubled write strobe WS2# should be used as the selected doubled write strobe WS2*m* to clock flip-flops 152 and 154. A multiplexer select WTFLAG indicates an even data burst when asserted and an odd data burst when negated.

For even data bursts, the FIG. 10 expander 140' operates in a manner similar to that of the FIG. 6 expander 140. The multiplexer select WTFLAG is asserted to indicate an even data burst. As a result, clock multiplexer 159 selects the doubled write strobe WS2 to clock flip-flops 152 and 154. Multiplexer 153 selects the output of flip-flop 144 to be driven on the second rising data packet QP1. Multiplexer 157 selects the output of flip-flop 148 to be driven on the second falling data packet QN1. Multiplexer 151 selects the output of flip-flop 142 to be sampled by flip-flop 152. Finally, multiplexer 155 selects the output of flip-flop 146 to be sampled by flip-flop 154.

For odd data bursts, the FIG. 10 expander 140'operates differently from the FIG. 6 expander 140. The multiplexer select WTFLAG is negated to indicate an odd data burst. As a result, clock multiplexer 159 selects the inverted doubled write strobe WS2# to clock flip-flops 152 and 154. Multiplexer 153 selects the output of flip-flop 142 to be driven on the second rising data packet QP1. Multiplexer 157 selects the output of flip-flop 146 to be driven on the second falling data packet QN1. Multiplexer 151 selects the output of flip-flop 144 to be sampled by flip-flop 152. Finally, multiplexer 155 selects the output of flip-flop 148 to be sampled by flip-flop 154.

Operation may be explained by referring to FIG. 11 for timing and FIGS. 5, 7, 9, and 10, for functionality. FIG. 11 shows two write cycles. A first write cycle includes an even data burst and a second write cycle includes an odd data burst. Because the even data burst of the first write cycle is similar in function to that described previously, there is no need to describe it in detail, except to show the differences in how the selected doubled write strobe WS2*m* is generated to clock flip-flops 152 and 154. As can be seen in FIG. 11, for the first write cycle, multiplexer select WTFLAG is asserted so the selected doubled write strobe WS2*m* follows the doubled write strobe WS2.

Operation of the second write cycle, which is an odd data burst, requires a more detailed explanation. The timing generator 160 determines that the second write cycle is an odd data burst based on when the write command is received relative to an even or odd clock cycle and, as a result, negates the multiplexer select EVWT. Operation of the receiver 120 is similar to that for even data bursts. As can be seen in FIG. 11, the falling data packet QN and rising data packet QP clock each clock in two data packets in the proper order of R2, F2, R3, and F3.

However, the first set of data packets (R2 and F2) are valid during the rising edge of the doubled write strobe WS2 whereas, in the even data burst, the first set of data packets (R0 and F0) are valid during the rising edge of the inverted doubled write strobe WS2#. As a result, the first set of data packets (R2 and F2) are clocked into flip-flops 144 and 148, respectively. At the next rising edge of the inverted doubled write strobe WS2# the second set of data packets (R3 and F3) are clocked into flip-flops 142 and 146, respectively. As can be seen from FIG. 11 for the even data burst, data packets R0 and F0 are respectively available on signals QPA0 and QNA0 before data packets R1 and F1 are respectively available on signals QPA1 and QNA1. However, for the odd data burst, data packets R3 and F3 are respectively available on signals QPA0 and QNA0 after data packets R2 and F2 are respectively available on signals QPA1 and QNA1.

The multiplexers are used in combination with the selected doubled write strobe WS2*m* to rearrange these data packets so they are presented to subsequent circuitry in the proper order. The QPA0 and QNA0 signals (i.e., R3 and F3) are selected to appear on the second rising data packet QP1 and second falling data packet QN1, respectively. In addition, the inverted doubled write strobe WS2# is selected to drive the selected doubled write strobe WS2*m* for clocking flip-flops 152 and 154. In addition, multiplexers 151 and 155 respectively select the signals QPA1 and QNA1 to be driven onto multiplexer outputs QP0*m* and QP1*m*. When flip-flops 152 and 154 are clocked, data packets R2 and F2 appear on the first rising data packet QP0 and first falling data packet QN0 in the proper order.

Completion of the operation is similar to operation of the FIG. 6 timing domain crossing apparatus 100. The re-timing strobe RTS latches the expansion signals 145 for presentation to additional circuitry (not shown) on the output signals 185.

In some cases, widening the expansion data window 240 to: tV2=2*tCK−tSQ−tJS, may not leave a large enough expansion data window 240. In these cases, the timing domain crossing apparatus of FIGS. 4 or 9 may be expanded by modifying the re-timing register 180' to increase the expansion data window 240 to: tV4=4*tCK−tSQ−tJS.

Figure 12:
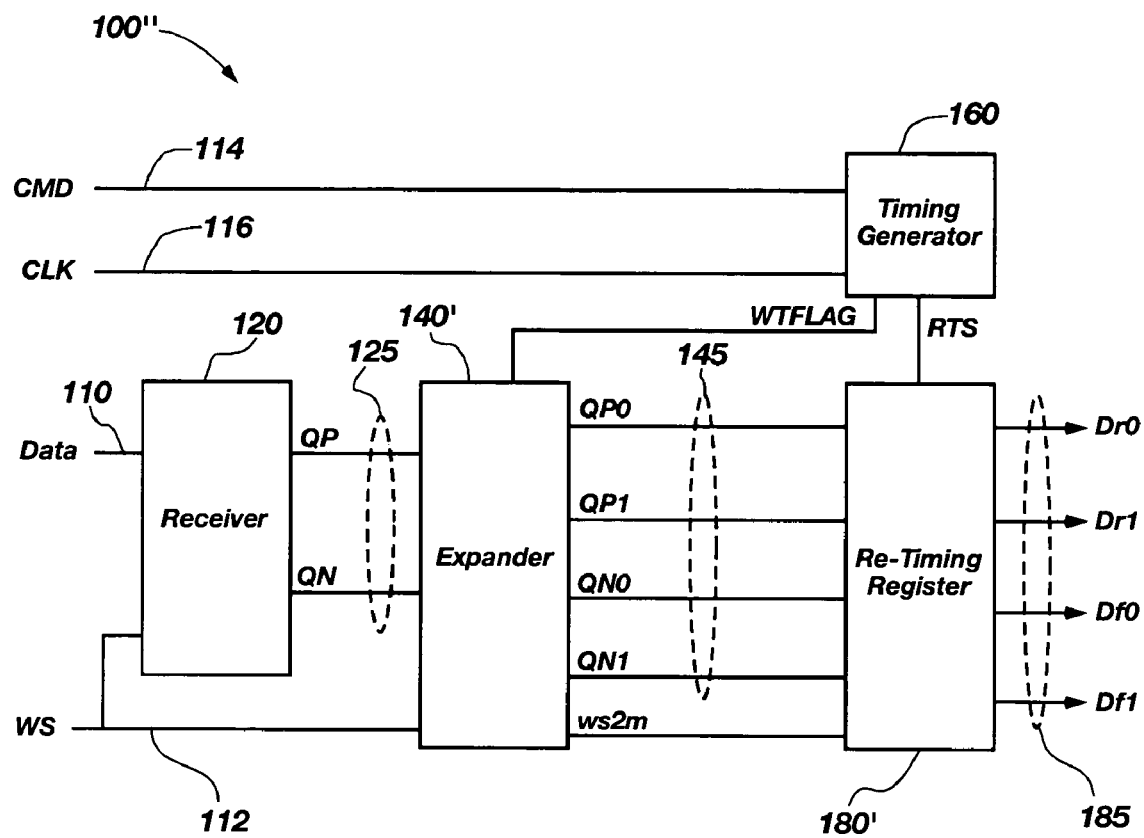
FIG. 12 is a block diagram illustrating another exemplary embodiment of a timing domain crossing apparatus according to the present invention.
Figure 13:
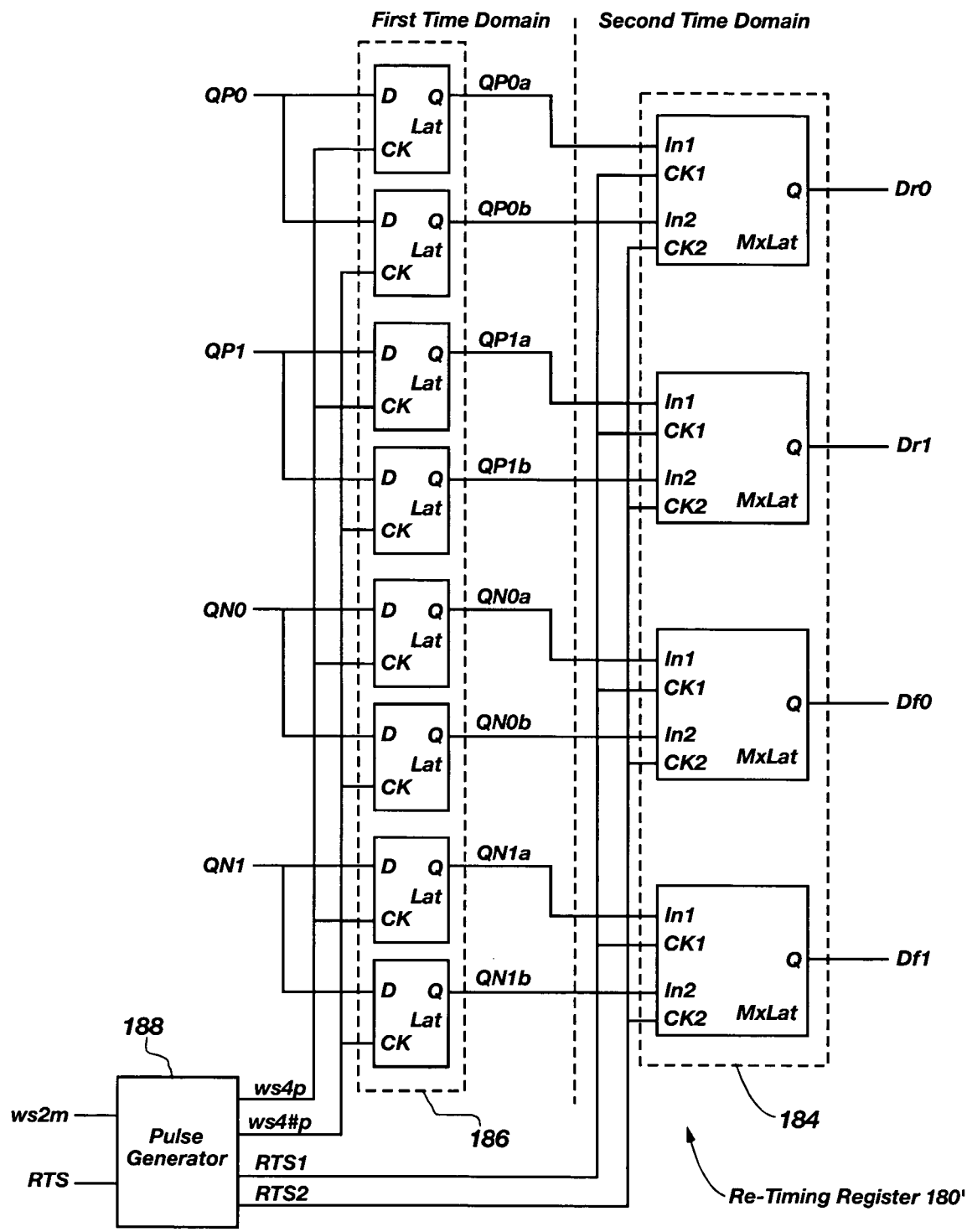
FIG. 13 is a block diagram illustrating another exemplary embodiment of a re-timing register.

Another embodiment of the timing domain crossing apparatus 100", shown in FIG. 12, generates this increased expansion data window 240 using the expander 140' embodiment of FIG. 10 and a different embodiment of the re-timing register 180', as shown in FIG. 13. The selected doubled write strobe WS2*m* is passed from the expander 140' to the re-timing register 180' to generate timing for the additional expansion from two to four clock cycles. FIG. 13 illustrates the re-timing register 180' used for an expansion data window 240 of about four clock cycles. In this embodiment, the re-timing register 180' contains a bank of latches 186 used for doubling the bus width of the data packets, thus allowing a doubling of the data window in which the data packets are valid. A bank of multiplexer latches 184 transfers the data packets to the second timing domain and reduces the bus width back to the four data packets used in other embodiments for presentation to additional circuitry (not shown) in the same manner as the previously described embodiments. The bank of multiplexer latches 184 are configured to latch the In1 input for presentation on the Q output when the CK1 input is asserted and latch the In2 input for presentation on the Q output when the CK2 input is asserted.

A pulse generator 188 creates the required strobes (ws4*p* and ws4#p) to latch data into the bank of latches 186 at the appropriate time in the first timing domain and the required strobes (RTS1 and RTS2) to latch data into the bank of multiplexer latches 184 in the second timing domain at the appropriate time. As can be seen in the timing diagram of FIG. 14, the ws4*p* and ws4#p strobes may be alternately generated from the selected doubled write strobe WS2*m*. The ws4*p* strobe may be generated on the first selected doubled write strobe WS2*m* and then every other selected doubled write strobe WS2*m*. Similarly, the ws4#p strobe may be generated on the second doubled write strobe WS2*m* and then every other selected doubled write strobe WS2*m*.

Figure 14:
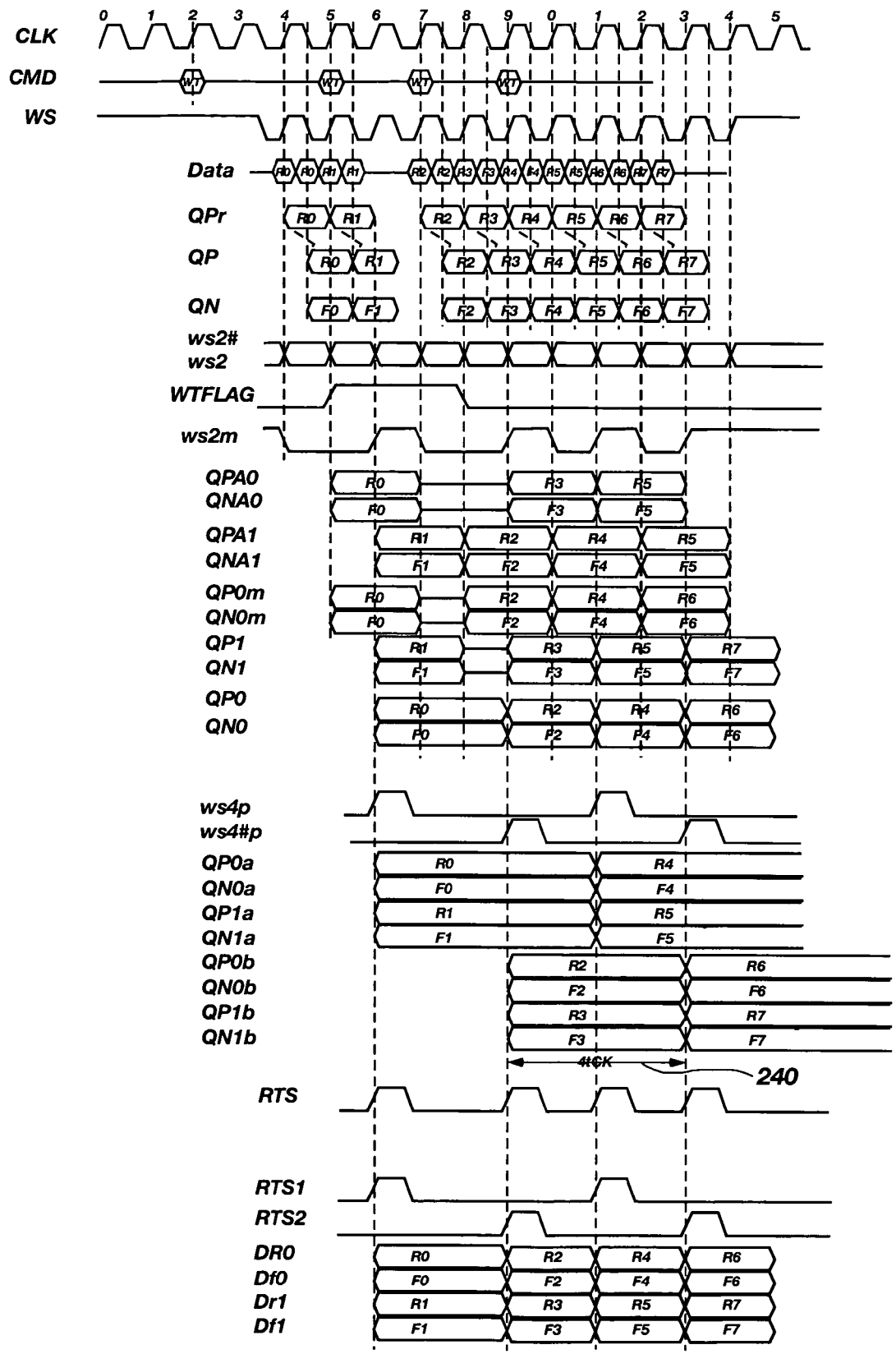
FIG. 14 is a timing diagram illustrating timing for various signals of the exemplary embodiment shown in FIG. 12.

Also, as can be seen in the timing diagram of FIG. 14, the RTS1 and RTS2 strobes may be alternately generated from the re-timing strobe RTS. The RTS1 strobe may be generated on the first re-timing strobe RTS and then every other re-timing strobe RTS. Similarly, the RTS2 strobe may be generated on the second re-timing strobe RTS and the every other re-timing strobe RTS. As with the previous embodiments, the trailing edge of the re-timing strobe RTS, which closes the latches, may be adjusted to place the trailing edge substantially near the center of the expansion data window 240.

The bank of latches 186 functions to double the bus width and, as a result, double the expansion data window 240 in much the same way as explained previously for the function of the expander 140. Once expanded, as the doubled expansion signals (QP0a, QP0b, QP1a, QP1b, QN0a, QN0b, QN1a, QNP1b), the data packets must be transferred to the second timing domain and reduced back to the bus width of the expansion signals 145 for presentation as the output signals 185. The multiplexer latches 184, in combination with strobes RTS1 and RTS2 accomplish the timing domain transfer and bus width reduction, while still allowing the expansion data window 240 of about four clock cycles. As can be seen in FIG. 14, the RTS1 strobe latches the data on the QP0a, QN0a, QP1a, and QN1a signals for presentation on the Dr0, Df0, Dr1, and Df1 output signals 185. Similarly, at the next re-timing strobe RTS, the RTS2 strobe latches the data on the QP0b, QN0b, QP1b, and QN1b signals for presentation on the Dr0, Df0, Dr1, and Df1 output signals 185.

Figure 15:
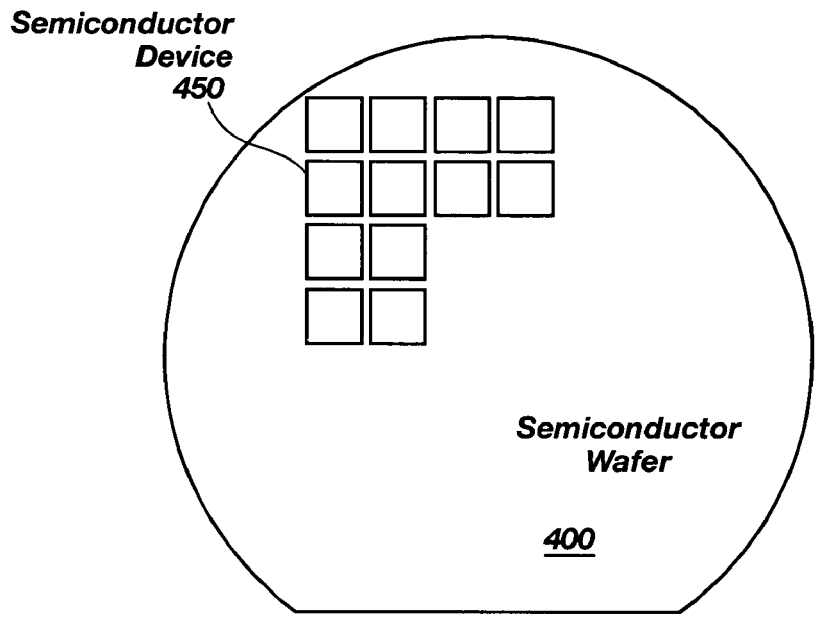
FIG. 15 is a semiconductor wafer including a plurality of semiconductor devices including a timing domain crossing apparatus according to the present invention.

As shown in FIG. 15, a semiconductor wafer 400, in accordance with the present invention, includes a plurality of semiconductor devices 450 incorporating a timing domain crossing apparatus (100, 100', 100") (not shown in FIG. 15) described herein. Of course, it should be understood that the semiconductor devices 450 may be fabricated on substrates other than a silicon wafer, such as, for example, a Silicon On Insulator (SOI) substrate, a Silicon On Glass (SOG) substrate, or a Silicon On Sapphire (SOS) substrate, a gallium arsenide wafer, an indium phosphide wafer, or other bulk semiconductor substrate. As used herein, the term "wafer" includes and encompasses all such substrates.

Figure 16:
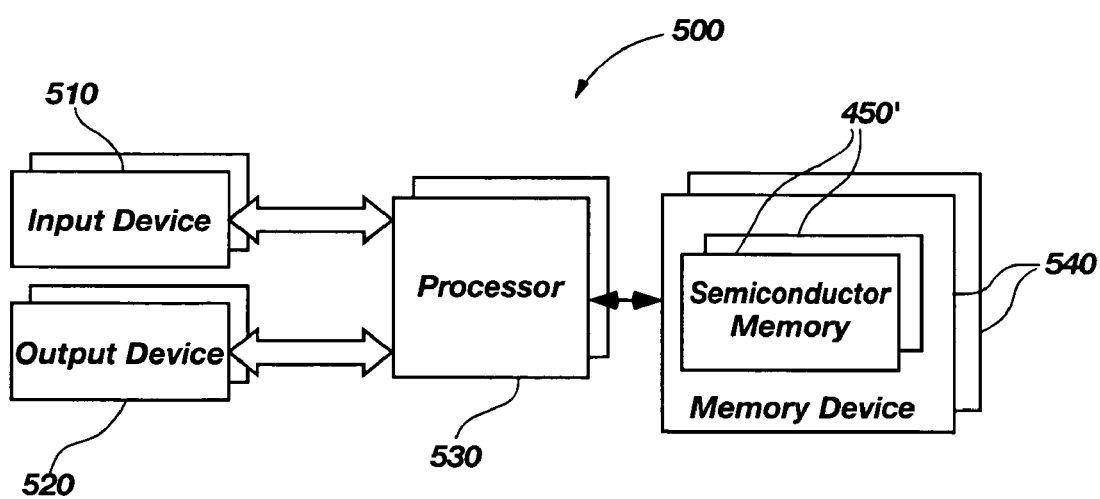
FIG. 16 is an electronic system diagram showing a plurality of semiconductor memories including timing domain crossing apparatus according to the present invention.

As shown in FIG. 16, an electronic system 500, in accordance with the present invention, comprises at least one input device 510, at least one output device 520, at least one processor 530, and at least one memory device 540. The memory device 540 comprises at least one semiconductor memory 450' incorporating a timing domain crossing apparatus (100, 100', 100") (not shown in FIG. 16) described herein in a DRAM device. It should be understood that the semiconductor memory 450' may comprise a wide variety of devices other than, or in addition to, a DRAM, including, for example, Static RAM (SRAM) device and Flash memory devices.

Although this invention has been described with reference to particular embodiments, the invention is not limited to these described embodiments. Rather, the invention is limited only by the appended claims, which include within their scope all equivalent devices or methods that operate according to the principles of the invention as described.

What is claimed is:

1. A method of transferring signals between timing domains, comprising:
    sampling a data signal with a sample clock associated with a first timing domain to generate a sampled data signal;
    generating a plurality of expansion signals, wherein each of the plurality of expansion signals replicates the sampled data signal for an expansion data window comprising a plurality of consecutive sample clock cycles;
    generating a re-timing strobe in a second timing domain such that the re-timing strobe is temporally positioned within the expansion data window; and
    sampling the plurality of expansion signals in the second timing domain using the re-timing strobe.

2. The method of claim 1, wherein:
    generating the plurality of expansion signals comprises generating N expansion signals for every data signal;
    the expansion data window comprises N consecutive sample clock cycles; and
    N is selected from the group consisting of 2 and 4.

3. A method of transferring signals between timing domains, comprising:
    sampling a data signal with a sample clock associated with a first timing domain to generate a sampled data signal;
    expanding the sampled data signal to a plurality of expansion signals valid for an expansion data window comprising a plurality of consecutive sample clock cycles;
    generating a re-timing strobe temporally positioned within the expansion data window, wherein the re-timing strobe is initiated by a signal in a second timing domain independent from the first timing domain;
    re-ordering the plurality of expansion signals to a predetermined order different from a receiving order of the sampled data signal; and
    sampling the re-ordered plurality of expansion signals in the second timing domain using the re-timing strobe.

4. The method of claim 3, wherein re-ordering the plurality of expansion signals further comprises:
    maintaining a data order of the plurality of expansion signals if the re-timing strobe is at a first position relative to a half-speed clock at half the frequency of the sample clock; and
    reversing the data order of the plurality of expansion signals if the re-timing strobe is at a second position relative to the half speed clock.

5. The method of claim 3, wherein:
    generating the plurality of expansion signals comprises generating N expansion signals;
    the expansion data window comprises N consecutive sample clock cycles; and
    N is selected from the group consisting of 2 and 4.

6. A timing domain crossing apparatus, comprising:
    an expander configured for sampling a data signal at a plurality of consecutive active edges of a sample clock to generate a plurality of expansion signals valid for an expansion data window comprising a plurality of consecutive clock cycles in a first timing domain;
    a timing generator configured for converting a command in a second timing domain to a re-timing strobe substantially synchronous with the first timing domain and temporally positioned within the expansion data window; and
    a re-timing register configured for sampling the plurality of expansion signals with the re-timing strobe.

7. The apparatus of claim 6, further comprising a receiver configured for sampling an input signal with the sample clock to generate the data signal.

8. The apparatus of claim 7, wherein the receiver is further configured for sampling a rising data packet on the input signal using a rising edge of the sample clock and sampling a falling data packet on the input signal using a falling edge of the sample clock to generate the data signal.

9. A timing domain crossing apparatus, comprising:
    an expander configured for generating a plurality of expansion signals valid for an expansion data window comprising a plurality of consecutive clock cycles by sampling a data signal at a plurality of consecutive active edges of a sample clock in a first timing domain;

a timing generator configured for generating a re-timing strobe temporally positioned within the expansion data window;

a data order adjuster configured for re-ordering the plurality of expansion signals to a predetermined order independent from a receiving order of the data signal; and a re-timing register configured for generating re-timed outputs by sampling the re-ordered plurality of expansion signals with the re-timing strobe.

10. The apparatus of claim 9, further comprising a receiver configured for sampling an input signal with the sample clock to generate the data signal for the expander.

11. The apparatus of claim 10, wherein the receiver is further configured for sampling a rising data packet on the input signal using a rising edge of the sample clock and sampling a falling data packet on the input signal using a falling edge of the sample clock.

12. The apparatus of claim 9, wherein the data order adjuster is further configured for preserving a data order of the plurality of expansion signals if the re-timing strobe is at a first position relative to a half speed clock running at half the frequency of the sample clock and switching the data order of the plurality of expansion signals if the re-timing strobe is at a second position relative to the half-speed clock.

13. A semiconductor device including at least one timing domain crossing apparatus, the at least one timing domain crossing apparatus comprising:

an expander for sampling a data signal at a plurality of consecutive active edges of a sample clock to generate a plurality of expansion signals valid for an expansion data window comprising a plurality of consecutive clock cycles in a first timing domain;

a timing generator for generating a re-timing strobe in a second timing domain such that the re-timing strobe is temporally positioned within the expansion data window; and a re-timing register for generating re-timed outputs by sampling the plurality of expansion signals with the re-timing strobe.

14. The semiconductor device of claim 13, further comprising a receiver for sampling an input signal with the sample clock to create the data signal.

15. An electronic system, comprising:

at least one processor; and at least one memory device operably coupled to the at least one processor and comprising at least one semiconductor memory including at least one timing domain crossing apparatus, the at least one timing domain crossing apparatus comprising:

an expander configured for sampling a data signal at a plurality of consecutive active edges of a sample clock to generate a plurality of expansion signals valid for an expansion data window comprising a plurality of consecutive clock cycles in a first timing domain;

a timing generator configured for generating a re-timing strobe in a second timing domain such that the re-timing strobe is temporally positioned within the expansion data window; and a re-timing register configured for sampling the plurality of expansion signals with the re-timing strobe.

16. The electronic system of claim 15, further comprising a receiver configured for sampling an input signal with the sample clock to generate the data signal for the expander.

17. A semiconductor device including at least one timing domain crossing apparatus, the at least one timing domain crossing apparatus comprising:

an expander configured for generating a plurality of expansion signals valid for an expansion data window comprising a plurality of consecutive clock cycles by sampling a data signal at a plurality of consecutive active edges of a sample clock in a first timing domain;

a timing generator configured for generating a re-timing strobe temporally positioned within the expansion data window responsive to a command in a second timing domain;

a data order adjuster configured for re-ordering the plurality of expansion signals to a predetermined order independent from a receiving order of the data signal; and a re-timing register configured for sampling the re-ordered plurality of expansion signals with the re-timing strobe.

18. The semiconductor device of claim 17, further comprising a receiver configured for sampling an input signal with the sample clock to generate the data signal for the expander.

19. The semiconductor device of claim 17, wherein the data order adjuster is further configured for preserving a data order of the plurality of expansion signals if the re-timing strobe is at a first position relative to a half speed clock running at half the frequency of the sample clock and switching the data order of the plurality of expansion signals if the re-timing strobe is at a second position relative to the half speed clock.

20. An electronic system, comprising:

at least one processor; and at least one memory device operably coupled to the at least one processor, comprising at least one semiconductor memory including at least one timing domain crossing apparatus, the at least one timing domain crossing apparatus comprising:

an expander configured for sampling a data signal at a plurality of consecutive active edges of a sample clock to generate a plurality of expansion signals valid for an expansion data window comprising a plurality of consecutive clock cycles in a first timing domain;

a timing generator configured for generating a re-timing strobe in a second timing domain such that the re-timing strobe is temporally positioned within the expansion data window;

a data order adjuster configured for re-ordering the plurality of expansion signals to a predetermined order independent from a receiving order of the data signal; and a re-timing register configured for sampling the re-ordered plurality of expansion signals with the re-timing strobe.

21. The electronic system of claim 20, further comprising a receiver configured for sampling an input signal with the sample clock to generate the data signal for the expander.

22. The electronic system of claim 20, wherein the data order adjuster is further configured for maintaining a data order of the plurality of expansion signals if the re-timing strobe is at a first position relative to a half-speed clock relative to the sample clock and reversing the data order of the plurality of expansion signals if the re-timing strobe is at a second position relative to the half-speed clock.

* * * * *